(12) United States Patent
Youssef et al.

(10) Patent No.: US 6,365,991 B1
(45) Date of Patent: Apr. 2, 2002

(54) METHOD AND STRUCTURE FOR MEASUREMENT OF A MULTIPLE-POWER-SOURCE DEVICE DURING A TEST MODE

(75) Inventors: Tom Youssef, Dallas; David Charles McClure, Carrollton, both of TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/450,108

(22) Filed: Nov. 29, 1999

(51) Int. Cl.[7] ................................................. H02J 9/04
(52) U.S. Cl. ............................. 307/66; 307/64; 307/80; 307/85; 324/763
(58) Field of Search ........................ 307/43, 65, 85, 307/86, 18, 11, 64, 80; 324/753, 760, 765, 763; 714/732, 724, 721; 365/229

(56) References Cited

U.S. PATENT DOCUMENTS 5,488,615 A * 1/1996 Kunoff et al. .............. 371/22.4
6,075,742 A * 6/2000 Youssef et al. .............. 365/229
6,167,543 A * 12/2000 Callahan ..................... 714/721

* cited by examiner

Primary Examiner—Josie Ballato
Assistant Examiner—Robert L. DeBeradinis
(74) Attorney, Agent, or Firm—Lisa K. Jorgenson; Renee M. Larson

(57) ABSTRACT

A test mode structure and method of a multi-power-source device provides for the device to remain in a test mode, during which current draw of the device may be accurately measured, even after primary power supply to the device has been greatly reduced or completely removed. Significant reduction or removal of the primary power supply while still remaining in the test mode is necessary to counter the presence of a variable current that would otherwise be normally generated by the multi-power-source device in the test mode; the presence of the variable current during the test mode, if not negated, will not permit an accurate measurement of the current draw of the multi-power-source device. Significant reduction or removal of the primary power supply to the device would typically cause the multi-power-source device to exit the test mode and switch to a secondary supply voltage supplied by the secondary power supply, thereby foiling any attempt to measure the current draw of the device. An external control signal provided to the device ensures that the test mode remains enabled, thereby inhibiting the device from exiting the test mode and switching to the secondary power supply in a normal operating mode.

24 Claims, 4 Drawing Sheets

METHOD AND STRUCTURE FOR MEASUREMENT OF A MULTIPLE-POWER-SOURCE DEVICE DURING A TEST MODE

BACKGROUND OF THE INVENTION

1. Field of the Invention

This invention relates generally to devices having both primary and one or more secondary power sources capable of supplying power, and more particularly to an improved test mode structure and method that accurately measures the current draw of such devices.

2. Background of the Invention

Devices having a primary power source and at least one secondary power source, both capable of supplying needed power, rely upon the secondary power source(s), such as a back-up battery, to supply needed power when the primary power source, such as an external power supply, is no longer sufficient to power the device. Such multiple power source devices, hereinafter referred to as "multi-power-source devices," have become such an indispensable part of technology that it would be difficult to enumerate all of the particular applications and environments in which they are used. Multi-power-source devices are often battery-backed devices, such as static random access memories (SRAMs) and battery-backed controllers and battery-backed power supplies, which are widely used in a variety of applications and environments. As used herein, the term "battery" refers to any technology capable of storing electrical charge that can be drawn on at some future time by the multi-power-source device in the event that the primary power supply to the device becomes insufficient or fails, and can include capacitors or other electrical storage devices.

Any multi-power-source device, however, is only as reliable as the secondary power source(s) that are providing back-up power to it. In the case of a battery-backed device that relies upon one or more batteries as secondary power sources, batteries are customarily rated, as reflected in their specification sheet, to provide or source a certain amount of current for a defined time period under nominal operating conditions. A battery may thus be guaranteed to source 600 nA of current for ten years at a nominal temperature, for instance. This battery is suitable for a particular device for ten years, then, only if it can be ascertained that the device will demand 600 nA under nominal operating conditions. Unless the current draw of the battery-backed device can be known with certainty, there is no way to guarantee that the particular battery will be sufficient for ten years.

In order to ensure that a particular secondary, back-up power source is sufficient to provide back-up power should it become needed, it is therefore necessary to know with certainty the expected current draw of the device. In many situations, the current draw of a multi-power-source device may readily ascertainable. In other situations, however, this is not the case. Consider, for instance, the current draw of a battery-backed integrated circuit (IC) device. Such IC devices are tested as a matter of course to prove that they will operate in accordance with their specification. A normal part of the IC testing process includes a burn-in step during which the IC device is subjected to voltage and temperature stresses to identify potential weaknesses of the device.

These stresses to which a device is subjected can cause the device to draw more current from a secondary power source or supply than it should. Device leakage can be induced by voltage and temperature stresses or by the stresses necessary to obtain infant-life defects of the device, for instance. The amount of current draw of the device upon the battery or other secondary power source may be difficult to readily measure, particularly in those instances in which the device is an IC device with a back-up battery, the leads of which are not readily accessible to a tester (as in when the back-up battery is attached to the IC after the burn-in step). From the foregoing discussion, it can be seen that there is a need in the art to be able to accurately measure the current of the device even when the battery itself is not readily accessible for testing.

SUMMARY OF THE INVENTION

It is accordingly an object of the present invention to ensure accuracy of measurement of the current draw of a multi-power-source device during a test mode of the device.

Therefore, according to the present invention, accuracy of measurement of the current draw of a multi-power-source device during a test mode of the device is ensured by a method and structure that prevents the generation of a variable current of the device during the test mode. The variable current is prevented by causing a primary power supply of the device to be greatly reduced or eliminated in such a manner as to not interfere with the test mode of the device. The test mode of the device is entered and enabled before the current draw of the device can be measured. According to a preferred embodiment, the test mode is entered by providing an elevated voltage to the device, higher than the primary power supply, and the test mode is enabled by setting one or more test bits of one or more data storage elements, such as registers, that minimally allow a control signal provided to the device to ensure that the test bits are not reset during the test mode.

The above as well as additional objectives, features, and advantages of the present invention will become apparent in the following detailed written description.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawings, wherein:

DESCRIPTION OF THE INVENTION

A test mode structure and method of a multi-power-source device, capable of being powered by either a primary power source or one or more secondary, back-up power sources, provides for the device to remain in a test mode even after the primary power supply has been greatly reduced or even completely removed. Significant reduction or removal of the primary power source or supply while still remaining in the test mode is necessary to counter the presence of a variable current that is normally generated by the device while in the test mode; the presence of the variable current during the test mode, if not negated, will not permit an accurate measurement of the current draw of the device. Significant reduction or removal of the primary power supply to the device would typically cause the device to exit the test mode and switch to a secondary supply voltage supplied by the secondary power source, thereby foiling any attempt to measure the current draw of the device. An external control signal provided to the device ensures that the test mode remains enabled, thereby inhibiting the device from exiting the test mode and switching to the secondary power source or supply in a normal operating mode.

The test mode of the multi-power-source device is entered and enabled before the draw current of the device can be measured. According to a preferred embodiment, the test mode is entered by providing an elevated voltage to the device, higher than the primary power supply, and the test mode is enabled by setting one or more test bits of one or more data storage elements, such as registers, that at the least allow a control signal provided to the device to ensure that the test bits are not reset during the test mode. The device requires no elevated voltage of the primary power supply once invoked, does not latch in the test mode, and consumes no current. The test mode circuit and method of the present invention is applicable to any device capable of being powered by a primary power supply or alternately by a secondary, back-up power supply, such as memory integrated circuits (ICs), like static random access memories (SRAMs), and controllers with no memory components.

Figure 1:
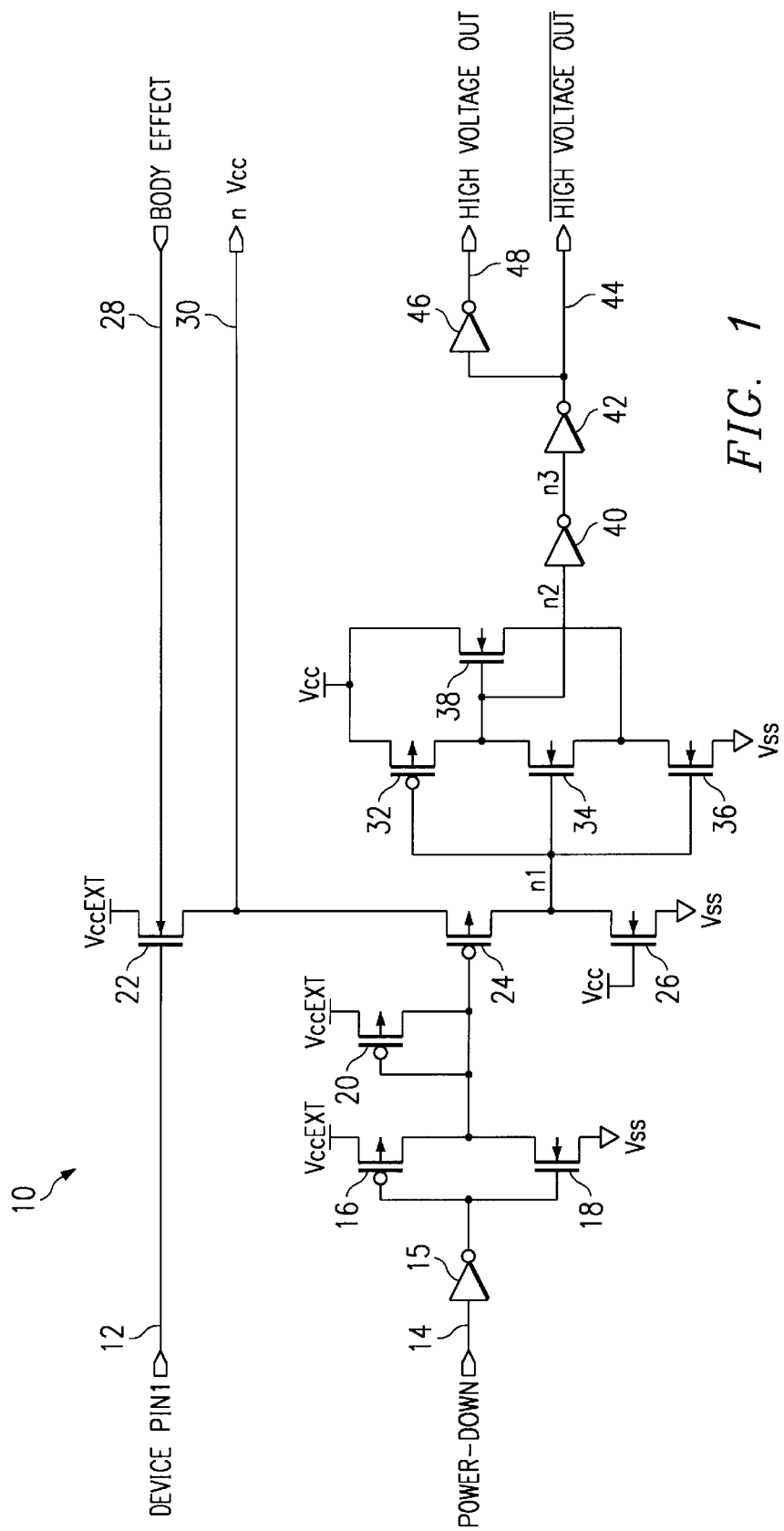
FIG. 1 is a control circuit of a multi-power-source device that is incapable of overcoming a variable current generated by the device and is therefore unable to accurately measure current draw of the device.

Referring now to FIG. 1, a control circuit 10 of a multi-power-source device that attempts to allow measurement of the device current is shown. It can be seen that circuit 10 has n-channel MOS transistors 18, 22, 26, 34, 36, 38, p-channel MOS transistors 16, 20, 24, 32, and inverters 15, 40, 42, 46, and is provided with input signal 12 on DevicePin1, power-down signal 14, and Body Effect signal 28. Circuit 10 generates nVcc signal 30, High Voltage Out bar signal 44 and High Voltage Out signal 48. Input signal 12 is provided to DevicePin1, representative of any device pin of the IC device, such as an address pin, that can be used to provide a voltage signal to circuit 10. In this figure and the drawings that follow, the terms "VccExt" and "Vcc1" refer to the primary power supplied to the circuit from a primary voltage source; "VccExt" specifically refers to the digital external power supplied to the circuit, such as to a pad of an IC device, and "Vcc1" specifically refers to the analog primary power supplied to the internal device circuits. "VccExt" and "Vcc1" are thus coupled together at some pad of the device, in the case of an IC circuit. The term "Vcc" refers to the substrate voltage of the IC device; the substrate is powered either by the external primary power supply VccExt or by the secondary power source, such as back-up battery, depending upon the adequacy of the primary supply voltage.

Figure 5:
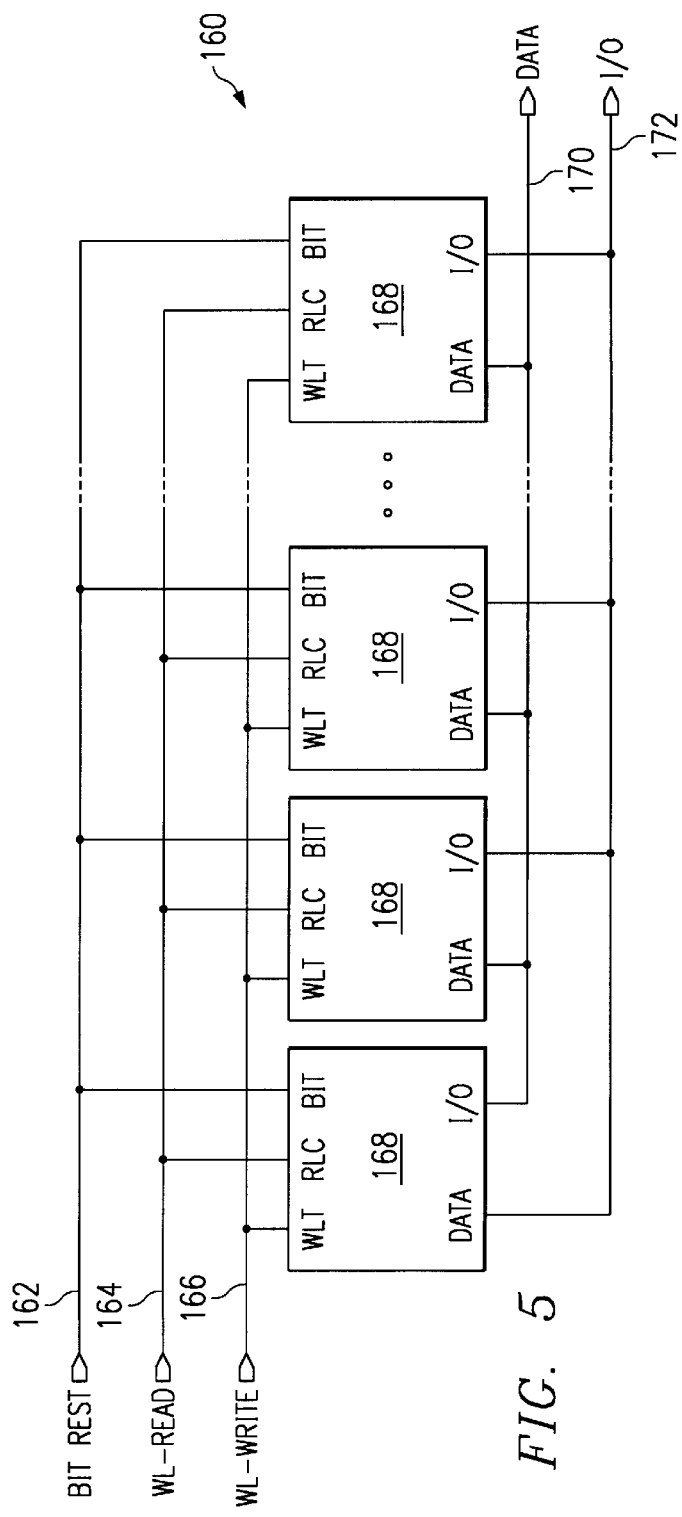
FIG. 5 is a block diagram of registers suitable for use as one or more data storage elements of the present invention.

The test mode of the device is invoked or entered by providing an elevated voltage on input signal 12 to DevicePin1 of the device; the elevated voltage of input signal 12 must be higher than the primary supply voltage VccExt and should preferably be at least VccExt+Vtn volts in the case of MOS transistor technology, where Vtn is the threshold voltage of an n-channel transistor. The test mode of the device, once invoked, is enabled and controlled through data storage elements or devices, such as registers, memory cells, capacitive elements, etc. The test mode is enabled by setting one or more test bits of one or more data storage elements, such as by writing a logic "1" to one or more shadow or testbit registers. FIG. 5 illustrates typical shadow or testbit registers that may be used as data storage elements in the invention. The addresses of shadow registers also typically operate to address the secondary or calibration registers of the device during a normal mode of operation. The shadow registers are reset or cleared if the external power supply VccExt drops below (Vtn+Vtp+small delta) volts, equal to approximately 2.3 volts for this circuit. Vtp is the threshold voltage of a p-channel transistor. As shown in FIG. 5, any number of registers 168 may be used. Bits of the registers are reset in accordance with the logic state of control signal 162. Wordline Read and Write signals 164, 166 allow the wordlines of the registers to be accessed in both the read and write modes.

The specific behavior of control circuit 10 of FIG. 1 will now be described. When input signal 12 on DevicePin1 is less than or equal to VccExt, node n1 is a low ("0") logic level, High Voltage bar output signal 44 is a high ("1") logic level, and the IC device operates in a normal operating mode. In normal operation, input signal 12 should not be higher than VccExt volts. To enter the test mode, an elevated voltage signal 12 is applied to DevicePin1 of the battery-backed device. The elevated voltage signal 12 is preferably at least VccExt+Vtn volts. The presence of the elevated voltage signal 12 at DevicePin1 causes the test mode to be entered. Node n1 will be a high logic level, High Voltage bar output signal 44 is a low logic level, and High Voltage output signal 48 is a high logic level. Also in the test mode, the Power Down signal 14 is a low logic level.

Figure 4:
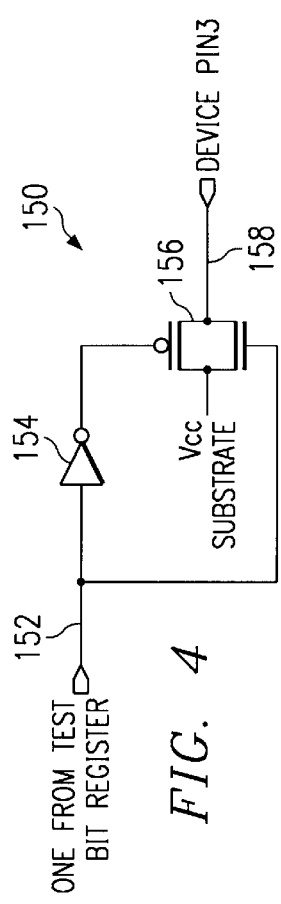
FIG. 4 is a flow chart of the methodology of the present invention for providing programmability of the data background patterns used to test random-access-memories, according to the present invention.

The shadow or test bit registers are accessible when the control signal High Voltage bar output signal 44 generated by control circuit 10 is a low logic level and High Voltage output signal 48 is a high logic level, thereby allowing one or more test bits of the shadow registers to be set by writing a high logic level signal to them. For instance, a "1" is written to a test bit of a shadow register to allow a signal 158 on DevicePin3 to power the device substrate, as shown in FIG. 4. When the signal 158 on DevicePin3 controls the device substrate in this manner, the voltage on VccExt and DevicePin3 can be lowered simultaneously to the level of the battery or other secondary power source, without causing the device to switch to the battery back-up power as it would in the normal operating mode. When the voltage of signal 158 on DevicePin3 is approximately equal to the battery voltage, such as 3 volts for a 3-volt device, the current draw of the device can then be measured through DevicePin3 using a standard parametric measurement tester. To ensure that the battery as rated will be adequate, the measured current should be approximately 600 nA to guarantee the 10-year battery life, continuing with the above example.

After the shadow register(s) or other data storage elements have been set, the voltage of input signal 12 on DevicePin1 can be any voltage, even zero volts, without re-setting or clearing the shadow register(s) as long as VccExt remains above a predetermined voltage level. If VccExt becomes less than the predetermined voltage level, then the voltage at n1 goes to a low logic state and High Voltage output signal 48 also goes low, causing the test bit(s) set in the shadow register(s) to clear to zero. Continuing with the embodiment of FIG. 1, the predetermined voltage level would be (Vtn+Vtp+small delta) volts, or approximately 2.3 volts. Since the test bit that was set to allow signal 158 on DevicePin3 to control the device substrate would be cleared, the end result would be that lowering VccExt below the predetermined voltage level would mean that the device current draw could not be measured.

Figure 2:
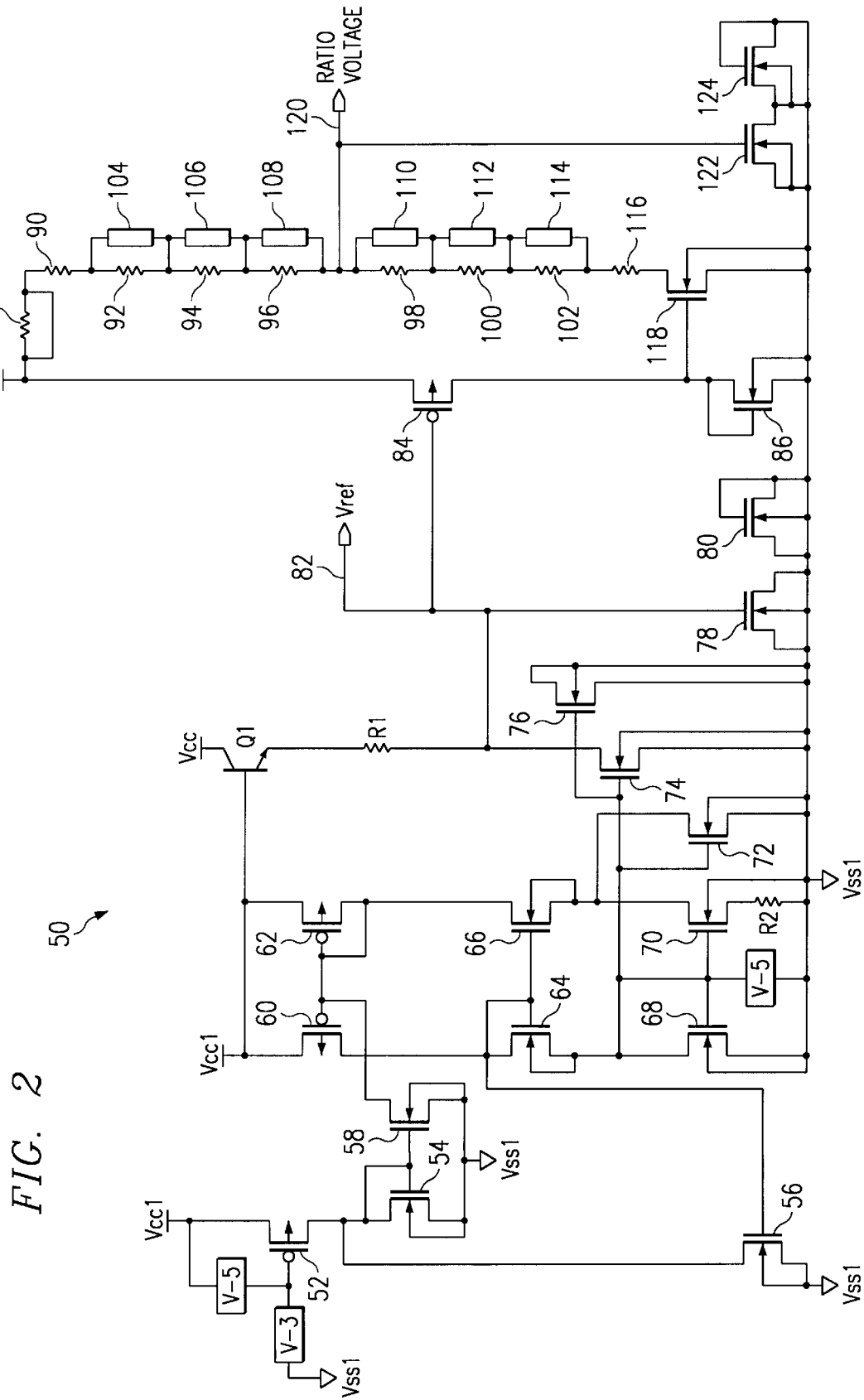
FIG. 2 is a schematic diagram of voltage reference circuitry of the multi-power-source device that is capable of generating the variable current during a test mode of the device.

Control circuit 10 of FIG. 1, then, would appear to allow the device current to be measured in an acceptable manner, so long as VccExt does not fall below the predetermined voltage level of approximately 2.3 volts. The difficulty with the circuitry of FIG. 1, however, is that the device current cannot be accurately measured at DevicePin3 when VccExt is approximately 3 volts due to the generation of a variable current in the test mode by other device circuitry. Referring now to FIG. 2, voltage reference circuit 50 or similar circuitry is commonly used in a multi-power-source device or system to generate the reference voltages that are used by a comparator function, not shown here, to determine when the device is to switch between a primary power supply voltage and a secondary, back-up supply voltage. Circuit 50 has p-channel MOS transistors 52, 60, 62, 84; n-channel transistors 54, 56, 58, 64, 66, 68, 70, 72, 74, 76, 78, 80, 86, 118, 122, 124; resistive elements R1, R2, 88–102, 116; bipolar transistor Q1; and fuses 104–114. Circuit 50 generates voltage reference Vref 82 and ratio voltage signal 120 as shown.

The primary power supply VccExt supplies voltage to the device so long as it is sufficient, i.e. above a predetermined voltage level and the voltage signals Vref 82 and ratio voltage 120 of FIG. 2 are used by a comparator function of the device to determine whether the primary or secondary power supply will provide voltage to the device. When the primary power supply becomes insufficient, as evidenced by VccExt being equal to or dropping below the predetermined voltage, the secondary power supply provides voltage to the device. In the case of a 3 volt device, for instance, the predetermined voltage level may be 2.5 volts. As previously mentioned, the Vref 82 and ratio voltage 120 voltages generated by circuit 50 are used by a comparison function of the device to determine when to switch between the primary power supply VccExt and the battery supply; the comparison function may be provided by a comparator or other circuitry that provides equivalent functionality that receives Vref and Ratio Voltage 120 as input signals and then generates an output signal indicative of which signal is greater. When Vref 82 is greater than Ratio Voltage 120, the output signal of the comparison function causes the primary supply voltage to supply power to the device. When, on the other hand, Vref 82 is less than Ratio Voltage 120, the output signal of the comparison function causes the circuit to switch to back-up power from the primary power supply.

The Q1 bipolar transistor of FIG. 2 creates a problem when attempting to accurately measure the current through address pad DevicePin3 of FIG. 4 while in the test mode. Transistor Q1 remains turned on. Recall that the substrate voltage Vcc is coupled to DevicePin3, shown in FIG. 4, thereby causing transistor Q1 to draw approximately 400 to 700 nA extra substrate current though DevicePin3 in the test mode; this variation in the extra current that is drawn by Q1 is due to the process variation between resistors R1 and R2. Since the current drawn by transistor Q1 in FIG. 2 varies and cannot be known with certainty, the current draw of the device also cannot be known with certainty unless this variable current is eliminated or greatly reduced while attempting to measure the current draw of the device. The variable current drawn by Q1 is eliminated or greatly reduced by taking internal analog voltage Vcc1 to zero volts.

It should be noted that Q1 does not introduce extra current through DevicePin3 during normal operation because the device switches from external power supply VccExt to battery power when VccExt becomes insufficient.

If Vcc1 goes below 2.3 volts, however, node n1 in FIG. 1 also will go to a low logic level, thereby causing High Voltage output signal 48 to go to a low logic level. The one or more test bits of the registers that are set are no longer protected by a high logic state of High Voltage output signal 48 and will clear to zero; the test bit that was set to allow signal 158 on DevicePin3 to control the device substrate will be cleared and thus the device current can no longer be measured at DevicePin3. Control circuit 10 of FIG. 1 cannot adequately address the variable current problem introduced by FIG. 2.

Figure 3:
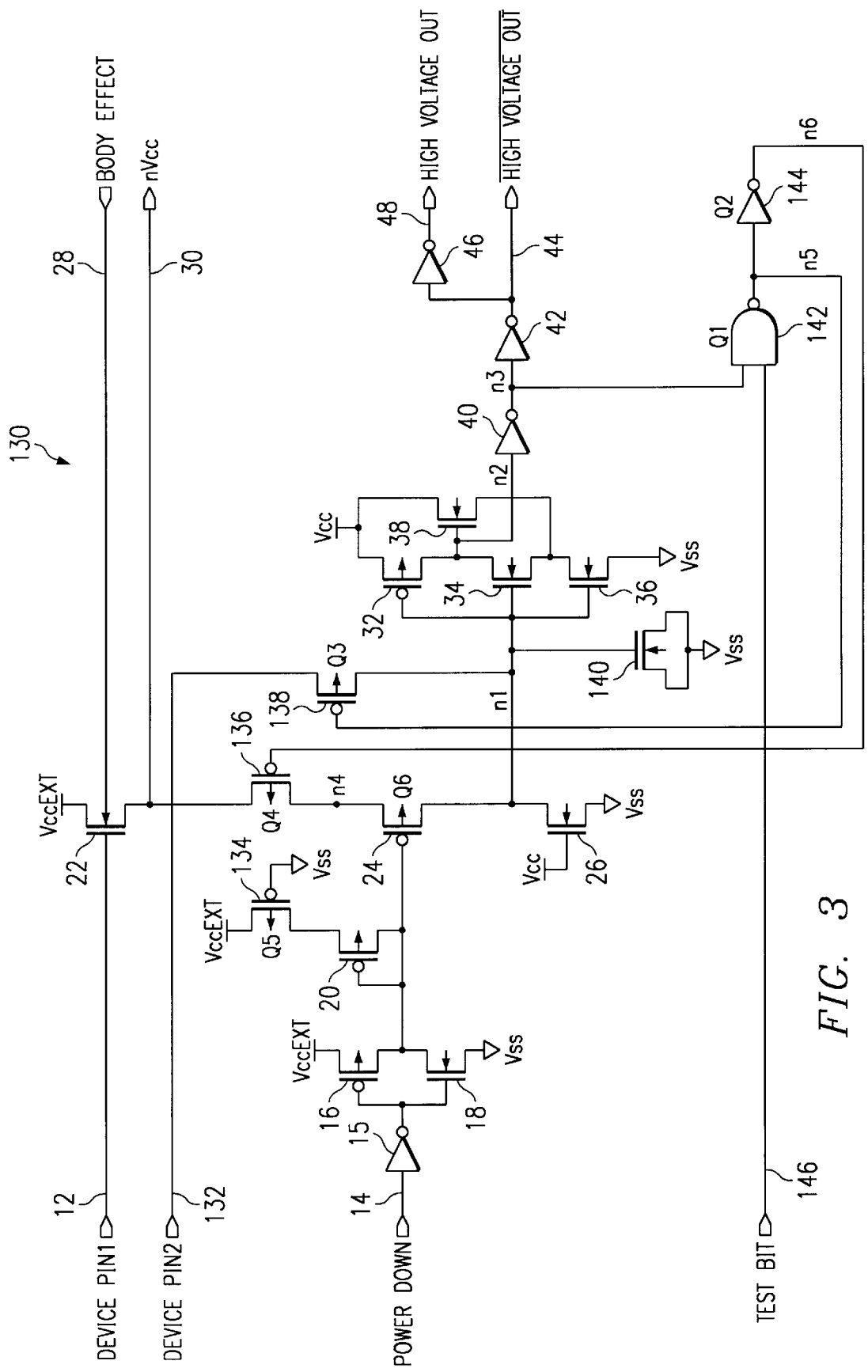
FIG. 3 is a control circuit of the multi-power-source device that is capable of providing for the accurate measurement of a current draw of the device during the test mode, according to the present invention.

This inability to adequately measure the current is remedied by modifying FIG. 1 as shown in FIG. 3. Referring now to control circuit 130 of FIG. 3, during normal operation when the device is powered by either the primary or secondary power sources, nodes n1 and n3 are both a low logic level. Q4 transistor 136 is ON and Q3 transistor 138 is driven OFF by Q1, Q2 transistors 142, 144. Q5 transistor 134 has been added and tracks Q4 transistor 136 so that the drain-to-source voltage Vds of transistor Q4 is equal to the Vds of transistor Q5. Test Bit input signal 146 represents the test bit that was set in a register or other data storage element to allow control signal 132 at DevicePin2 to cause High Voltage output signal 48 to always be a high logic state in the test mode, thereby protecting the one or more test bits from being reset or cleared. Test Bit input signal 146 is a low logic level ("0") during normal operation of the IC device.

In order to accurately measure the current through DevicePin3 in FIG. 4, the test mode must be entered. An elevated voltage of at least VccExt+Vtn volts is applied to signal 12 on DevicePin1 to enter the test mode. When the elevated voltage is applied to signal 12 on DevicePin1, node n1 is a logic high level and High Voltage bar output signal 44 is a low logic level and the test mode is invoked. Once the test mode is invoked, the shadow or test bit registers are accessible and the one or more test bits of the registers may be set. Test Bit 146 from a shadow register is written to a high logic level at this time. It is noted here that the Bit Reset control signal 162 shown in FIG. 5 is a signal that is in some manner derived from High Voltage out signal 48. Bit Reset signal 162 may thus be simply High Voltage out signal 48 inverted or it may be more elaborate derivation of High Voltage out signal 44; the important aspect is that Bit Reset signal 162 is determined in some manner from the High Voltage out signal 44 that is generated by the control circuit 130 of FIG. 3. A logic high signal is written to a bit of a shadow register to allow the signal 158 on DevicePin3 pad to control the substrate, as evidenced by the logic high "1" level of Test Bit signal 146. The signals 132 of FIG. 3 and 158 of FIG. 4 at DevicePin2 and DevicePin3, respectively, are both at the VccExt voltage level. When node n5 goes low due to Test Bit 146 being a high logic level, node n6 goes high. Q4 transistor 136 is OFF to isolate VccExt from node n4 in case Q6 transistor 24 is ON. Q3 transistor 138 turns on and signal 132 on DevicePin2 can now control node n1. Node n1 will remain a high logic level, High Voltage bar output signal 44 is at a low logic level and High Voltage output signal 48 is at a high logic level. Both VccExt and input signal 12 on DevicePin1 are free to go to zero volts since High Voltage output signal 48 will remain high, as controlled by control signal 132 on DevicePin2, and the test bit or shadow registers will not clear regardless of the voltage level of VccExt. If VccExt goes to zero volts, NPN transistor Q1 of FIG. 2 is turned OFF and thus will not draw extra substrate current through DevicePin3 of FIG. 4. The current measured through DevicePin3 in the test mode will now be an accurate measurement of the device current.

The preferred embodiment of the present invention discloses a multi-power-source IC device through which control signals 12, 132, and 158 are presented to external device pins DevicePin1, DevicePin2, DevicePin3, respectively, of the IC. It is understood, however, that these control signals need not be presented to external device pins of an IC device, particularly when the device is not an IC device or when an IC device is at wafer level and is not yet housed in a device package having external device pins.

While the invention has been particularly shown and described with reference to a preferred embodiment, it will be understood by those skilled in the art that various changes in form and detail may be made therein without departing from the spirit and scope of the invention.

What is claimed is:

1. A structure of a multi-power-source device that facilitates maintenance of a test mode of the multi-power-source device, comprising:
   a control element of the multi-power-source device that receives a first control signal and a second control signal and generates a third control signal, wherein when the first control signal is an elevated voltage greater than a primary supply voltage provided to the device from a primary voltage source the multi-power-source device enters the test mode,
   wherein during the test mode the second control signal provided to the control element causes the third control signal to be the first logic state and maintain the multi-power-source device in the test mode even if the primary supply voltage falls below a predetermined voltage sufficient in a normal operating mode of the multi-power-source device to cause the multi-power-source device to switch from the primary voltage source to a secondary voltage source to supply the multi-power-source device with a secondary supply voltage.

2. The structure of claim 1, further comprising:
   one or more data storage elements having one or more test bits capable of being set and re-set, wherein upon the multi-power-source device entering the test mode the one or more test bits of the one or more data storage elements are set to enable the test mode and the one or more test bits remain set so long as the third control signal is a first logic state.

3. The structure of claim 2, wherein the control element further comprises:
   a first transistor, having a control terminal, a first terminal, and a second terminal, that receives and is controlled by the first control signal at the control terminal, wherein the first terminal of the first transistor is coupled to the primary supply voltage;
   a second transistor having a first terminal coupled to the second terminal of the first transistor, a second terminal, and a control terminal;
   a third transistor having a first terminal coupled to the second terminal of the second transistor and having a second terminal coupled to a nominal reference voltage; and
   a fourth transistor having a first terminal coupled to the second control signal and having a second terminal coupled to the nominal reference voltage and the second terminal of the third transistor at a node,
   a logic element, coupled to the node and controlled by a test bit of the one or more test bits, that generates a fourth control signal that controls the control terminal of the second transistor,
   wherein when the first control signal is the elevated voltage and the multi-power-source device enters the test mode, the second transistor conducts and the node is the first logic state, and
   wherein after the test mode is entered and the primary supply voltage falls below the predetermined voltage, the test bit is set and the second transistor does not conduct, the fourth transistor conducts, and the second control signal maintains the node at the first logic state and the third control signal at the first logic state.

4. The structure of claim 3, wherein after the test mode is entered and the primary supply voltage falls below the predetermined voltage and the test bit is set, the second transistor does not conduct to isolate the primary supply voltage from the third transistor.

5. The structure of claim 1, further comprising:
   a variable current element of the multi-power-source device capable of generating a variable current during the test mode.

6. The structure of claim 5, wherein during the test mode the primary supply voltage falls below the predetermined voltage to a voltage level necessary to eliminate the variable current generated by the variable current element of the multi-power-source device and thus permit accurate measurement of the draw current of the multi-power-source device.

7. The structure of claim 6, wherein the primary supply voltage falls to a zero voltage level.

8. The structure of claim 5, wherein the variable current element of the multi-power-source device is a voltage reference circuit of the multi-power-source device that during the normal operating mode of the multi-power-source device generates a reference voltage signal used by the multi-power-source device to determine when to switch between the primary voltage source and the secondary voltage source.

9. The structure of claim 1, wherein the control element receives the first control signal at a first device pin of the multi-power-source device and the second control signal at a second device pin of the multi-power-source device, and wherein during the test mode the draw current of the multi-power-source device is measured at a third device pin of the multi-power-source device.

10. The structure of claim 1, wherein the control element further comprises:
    a first transistor, having a control terminal, a first terminal, and a second terminal, that receives and is controlled by the first control signal at the control terminal, wherein the first terminal of the first transistor is coupled to the primary supply voltage;
    a second transistor having a first terminal coupled to the second terminal of the first transistor and having a second terminal;
    a third transistor having a first terminal coupled to the second terminal of the second transistor and having a second terminal coupled to a nominal reference voltage; and
    a fourth transistor having a first terminal coupled to the second control signal and having a second terminal coupled to the nominal reference voltage and the second terminal of the third transistor at a node, wherein when the first control signal is the elevated voltage and the multi-power-source device enters the test mode, the second transistor conducts and the node is the first logic state, and wherein after the test mode is entered and the primary supply voltage falls below the predetermined voltage the second transistor does not conduct, the fourth transistor conducts, and the second control signal maintains the node at the first logic state and the third control signal at the first logic state.

11. The structure of claim 1, wherein during the test mode the second control signal causes the third control signal to be the first logic state and maintain the multi-power-source device in the test mode even if the first control signal is no longer the elevated voltage.

12. The structure of claim 11, wherein the second control signal maintains the multi-power-source device in the test mode if the first control signal falls to zero volts.

13. A structure of a multi-power-source device that facilitates maintenance of a test mode of the multi-power-source device, comprising:

a control element of the multi-power-source device that receives a first control signal and a second control signal and generates a third control signal, wherein when the first control signal is an elevated voltage greater than a primary supply voltage provided to the device from a primary voltage source the multi-power-source device enters the test mode;

means for enabling the test mode after the multi-power-source device enters the test mode, wherein the test mode is enabled by the means for enabling the test mode so long as the third control signal is a first logic state;

means for ensuring that the third control signal is the first logic state even if the primary supply voltage falls below a predetermined voltage sufficient in a normal operating mode of the multi-power-source device to cause the multi-power-source device to switch from the primary voltage source to a secondary voltage source to supply the multi-power-source device with a secondary supply voltage.

14. The structure of claim 13, further comprising:

a variable current element of the multi-power-source device capable of generating a variable current during the test mode.

15. The structure of claim 14, wherein during the test mode the primary supply voltage falls below the predetermined voltage to a voltage level necessary to eliminate the variable current generated by the variable current element of the multi-power-source device and thus permit accurate measurement of the draw current of the multi-power-source device.

16. The structure of claim 15, wherein the primary supply voltage falls to a zero voltage level.

17. The structure of claim 13, wherein the control element receives the first control signal at a first device pin of the multi-power-source device and the second control signal at a second device pin of the multi-power-source device, and wherein during the test mode the draw current of the multi-power-source device is measured at a third device pin of the multi-power-source device.

18. The structure of claim 13, wherein the means for enabling the test mode comprises one or more data storage elements having one or more test bits capable of being set and re-set, wherein upon the multi-power-source device entering the test mode the one or more test bits of the one or more data storage elements are set and remain set so long as the third control signal is a first logic state.

19. The structure of claim 13, wherein the means for ensuring that the third control signal is the first logic state is the control element controlled by the second control signal.

20. The structure of claim 13, further comprising:

means for measuring the draw current of the multi-power-source device while in the test mode.

21. The structure of claim 20, wherein the means for measuring the draw current is a device pin of the multi-power-source device.

22. The structure of claim 13, wherein the control element further comprises:

a first transistor, having a control terminal, a first terminal, and a second terminal, that receives and is controlled by the first control signal at the control terminal, wherein the first terminal of the first transistor is coupled to the primary supply voltage;

a second transistor having a first terminal coupled to the second terminal of the first transistor and having a second terminal;

a third transistor having a first terminal coupled to the second terminal of the second transistor and having a second terminal coupled to a nominal reference voltage; and a fourth transistor having a first terminal coupled to the second control signal and having a second terminal coupled to the nominal reference voltage and the second terminal of the third transistor at a node, wherein when the first control signal is the elevated voltage and the multi-power-source device enters the test mode, the second transistor conducts and the node is the first logic state, and wherein after the test mode is entered and the primary supply voltage falls below the predetermined voltage the second transistor does not conduct, the fourth transistor conducts, and the second control signal maintains the node at the first logic state and the third control signal at the first logic state.

23. The structure of claim 13, wherein during the test mode the second control signal causes the third control signal to be the first logic state and maintain the multi-power-source device in the test mode even if the first control signal is no longer the elevated voltage.

24. The structure of claim 23, wherein the second control signal maintains the multi-power-source device in the test mode if the first control signal falls to zero volts.

* * * * *